US006635154B2

(12) United States Patent
Johnson et al.

(10) Patent No.: US 6,635,154 B2
(45) Date of Patent: Oct. 21, 2003

(54) METHOD AND APPARATUS FOR MULTI-TARGET SPUTTERING

(75) Inventors: Paul Markoff Johnson, Santa Clara County, CA (US); Norman H. Pond, Santa Clara County, CA (US); Robert Ruck, Santa Clara County, CA (US); Nathan Fo, Santa Clara County, CA (US)

(73) Assignee: Intevac, Inc., Santa Clara, CA (US)

( * ) Notice: Subject to any disclaimer, the term of this patent is extended or adjusted under 35 U.S.C. 154(b) by 7 days.

(21) Appl. No.: 10/006,899

(22) Filed: Nov. 3, 2001

(65) Prior Publication Data

US 2003/0085114 A1 May 8, 2003

(51) Int. Cl.⁷ .......................... C23C 14/35; C23C 14/34
(52) U.S. Cl. ........................ 204/192.12; 204/298.09; 204/298.12; 204/298.16; 204/298.23
(58) Field of Search ................. 204/192.12, 192.13, 204/298.12, 298.03, 298.09, 298.23, 298.16, 298.11

(56) References Cited

U.S. PATENT DOCUMENTS

| | | | |
|---|---|---|---|
| 5,215,420 A | 6/1993 | Hughes et al. ............. 414/217 |
| 5,705,044 A | 1/1998 | Washburn et al. ....... 204/298.25 |
| 6,328,856 B1 | * 12/2001 | Brucker ................. 204/192.12 |
| 6,328,858 B1 | * 12/2001 | Felsenthal et al. ...... 204/192.15 |
| 6,461,484 B2 | 3/2002 | Yo et al. ................. 204/192.12 |
| 2002/0003086 A1 | * 1/2002 | Sferlazzo ............... 204/298.11 |

OTHER PUBLICATIONS

S.M. Williams, H. Q. Yang, J. B. Ketterson, Minature multitarget sputtering system for the in situ x–ray study of high Tc multilayer film growth, J. Vac. Soc. Technol. A 12(2), Mar./Apr. 1994 p. 598 published by the American Vacuum Society.
K. Wasa & S. Hayakawa (Noyes Publications 1992) Handbook of Sputter Deposition Technology pp. 110–112.
Intevac's New ALX 1000 Reactive Sputtering of Alumina for Thin Film Head Wafers, Exact date of publication is unknown but publication took place prior to the year 2000.

* cited by examiner

Primary Examiner—Steven H. VerSteeg
(74) Attorney, Agent, or Firm—Stanley Z. Cole; Edward Berkowitz

(57) ABSTRACT

Sequential sputtered film deposition of distinct materials on a workpiece is obtained with discrete targets composed of such distinct materials disposed on separate area portions of a common cathode/heatsink. Sputtering without cross contamination of the deposited films is enabled during an interval of relative motion between the target and workpiece or in an indexed static relative disposition, wherein the workpiece projection is entirely proximate one such portion to deposit the respective layer.

14 Claims, 15 Drawing Sheets

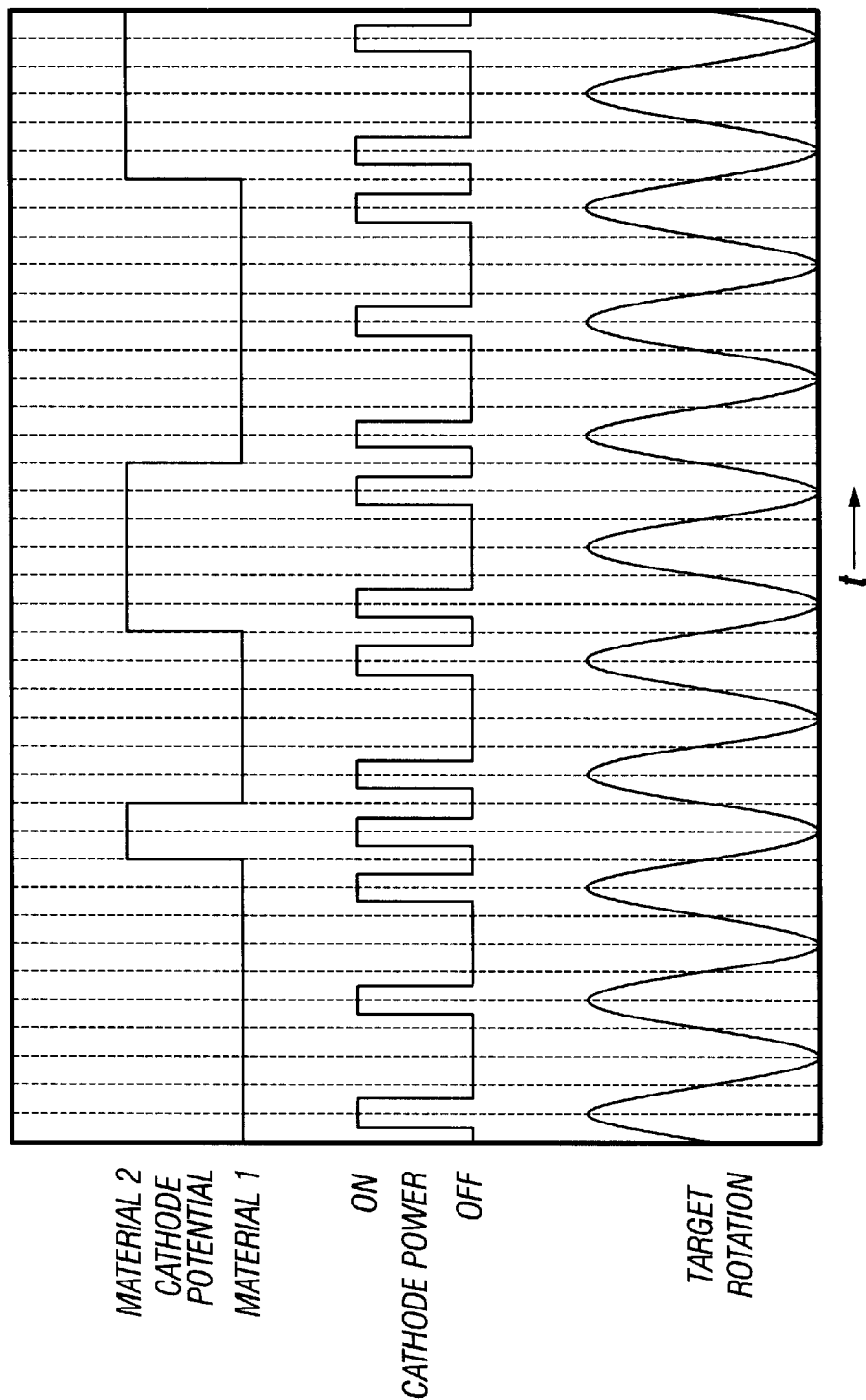

METHOD AND APPARATUS FOR MULTI-TARGET SPUTTERING

FIELD OF THE INVENTION

The invention is in the field of sputtering apparatus and methods and pertains more specifically to sequential deposition of disparate material layers from a composite target assembly.

BACKGROUND OF THE INVENTION

Sputtering is a commercially preferred process for deposition of homogeneous films of controled thickness. In particular, contemporary media for information storage purposes is generally fabricated through sputter deposition of materials for magnetic, or optical storage.

It is especially desirable to form a multi-layered medium such as shown in FIG. 1 where alternating films 6 and 8 of, for example, cobalt and platinum respectively, are deposited on a substrate 4. These layers may approach aggregate thickness of the order of $10^2$ to $10^3$ angstroms in many applications, with minimum single layer thicknesses of 2 to 3 angstroms. Multilayered structures of this type exhibit excellent magnetic properties and particularly find application in very high density information storage wherein the magnetic vector of a stored bit is substantially directed toward the normal to the plane of the layered medium. An initial underlayer(s) and final layer(s), not shown, complete the layered structure for its intended purpose. The sequence of adjacent layers ("bilayers") may number in the neighborhood of 15–30 in typical storage applications. It is desirable, for specific applications, that the thickness of layers 6 and 8 be independently controllable and put down without cross contamination during deposition. Layered sequences involving more than two sputterable materials may be required in selected applications.

Apparatus is known that employs multiple independent discrete sputter sources within a common vacuum housing for deposition of a series of distinct layers via reactive processes. A representative apparatus of this type disposes four DC magnetrons azimuthally about the axis of a rotatable pallette facing the array of sputter sources for supporting a number of substrates. Alternating in position between the DC magnetrons are (four) reactive gas plasma cells for controlled oxidation of a sputtered aluminum layer to produce alumina layers on the substrates. The pallette rotation accomodated either a continuous or indexed rotational mode. Systems of this general description were available under the designation, ALX 1000 from the assignee of the present invention.

Another prior art sputtering system includes a multi-species sputtering source including concentric target rings coaxially disposed in relation to a concentric coil magnetron. In this system, selection of sputtering target is accomplished by magnetic manipulation of a plasma to the ring shaped region proximate to one of either the inner or outer target ring. See U.S. Pat. No. 5,705,044.

It is also known in prior art to employ a sputtering target comprising different area portions of distinct sputtering materials for the deposition of a thin film alloy of desired composition onto a workpiece. See "Handbook of Sputter Deposition Technology", K. Wasa and S. Hayakawa (Noyes Publications, 1992).

Although an information storage medium is the exemplary application for the present invention, other applications include components for optical circuits and specialized optical components, and for fabrication of thin film laminated structures of both periodic and aperiodic form.

The present invention allows fabrication of these multi-layered structures with excellent control of sputter deposition featuring an exceptionally high freedom from cross contamination of individual deposited layers, without excesive handling of the substrate, obtaining commercial efficiency characterized by rapid throughput.

SUMMARY OF THE INVENTION

In the present invention, a large area sputtering target is formed of distinct surface area portions. Each adjacent pair of surface area portions comprise distinct sputterable materials, as for example a cobalt portion adjacent to a platinum portion. A workpiece is disposed proximate the target and capable of relative displacement opposite different sputterable areas of a sputter target comprising distinct surface portions. Linear dimensions of the workpiece do not exceed the dimensions of a given sputterable portion of the target so that the workpiece can be positioned in its entirety opposite such selected surface portion or relatively rotated (or, in an alternate geometry, translated) continuously with respect to the target. A sputtered film from the proximate sputterable target portion is deposited on the workpiece in conventional fashion. In a preferred embodiment, the projection of the workpiece on the target is stationary as the target moves relative to the facing (planar) workpiece. In a dynamic mode of operation, sputter deposition is enabled during selected intervals of relative motion when the workpiece and a selected portion of the target are juxtaposed. In a static mode of operation the selected target is indexed to a position opposite the workpiece and sputtering is enabled for the desired deposition time, after which the target is repositioned (indexed) for the next deposition. Sputtering is enabled, for example by gating on a high voltage power supply to excite a spatially well defined plasma discharge only during a desired interval while the selected target portion is proximate the facing well defined plasma projection on the target. The workpiece, spaced from the other side of the plasma discharge, receives the sputtered flux from the target. In like manner, the sputtering discharge is gated off as the moving well defined projection of the plasma discharge on the target (dynamic mode) approaches a boundary delimiting an adjacent target portion. The discharge may be terminated earlier, if the sputtering interval is sufficient to yield the desired thickness film on the workpiece in a single pass across the selected target portion. This operation is repeated in respect of the next adjacent target portion to produce alternating films of the respective materials on the workpiece.

The target is disposed within a housing into which the workpiece is introduced. In a preferred geometry, the workpiece is stationary and faces a rotating target wheel comprising at least two sectors, for example, approximately 180° sectors of cobalt and platinum, respectively. A magnetic field is axially aligned with the mutual perpendicular between workpiece and target to sustain a plasma discharge upon application of a suitable potential between the target and housing. The magnetic field is carefully designed to provide a field distribution roughly occupying a generally cylindrical region sharply delimited in its radial extent. The plasma discharge is distributed in a region between the target and the workpiece and exhibits a well defined projection on the target by virtue of the properties of the magnetic field distribution. An apertured shield is disposed between workpiece and the target, surrounding the projection of the plasma on the target and protecting the target from cross contamination by back-sputtering and generally limiting sputter deposition on surfaces other than the workpiece. When the projection of this aperture on the target wheel is entirely within the desired sector, an enabling logic level causes the power supply to excite a plasma discharge and in like manner, the de-excitation gate signal is generated as the leading edge of the plasma projection on the target approaches the boundary separating adjacent sectors. The angular position of the target wheel is derived from a shaft position encoder providing an input to a sputter module controller. The scale of achievable thickness deposited for a single pass depends upon the sputtering material, rotation rate, pressure, power dissipated in the plasma, possible biases applied to the workpiece, and duty cycle(s) of such plasma excitation. A plurality of full rotations may be employed to intersperse desired ratios of thickness for adjacent layers.

In another embodiment, the workpiece is translated in linear motion with respect to an array of target portions with appropriate position encoding to inform a controller in like manner to the above, for deposit of the desired sputtered films.

BRIEF DESCRIPTION OF THE DRAWINGS

FIG. 3b is a block diagram of the module including the sputtering station of FIG. 3a.

FIG. 6b is a timing diagram for a sequence of 2 layers in the ratios 3:1, 2:2, and 3:2.

DETAILED DESCRIPTION

Figure 2:
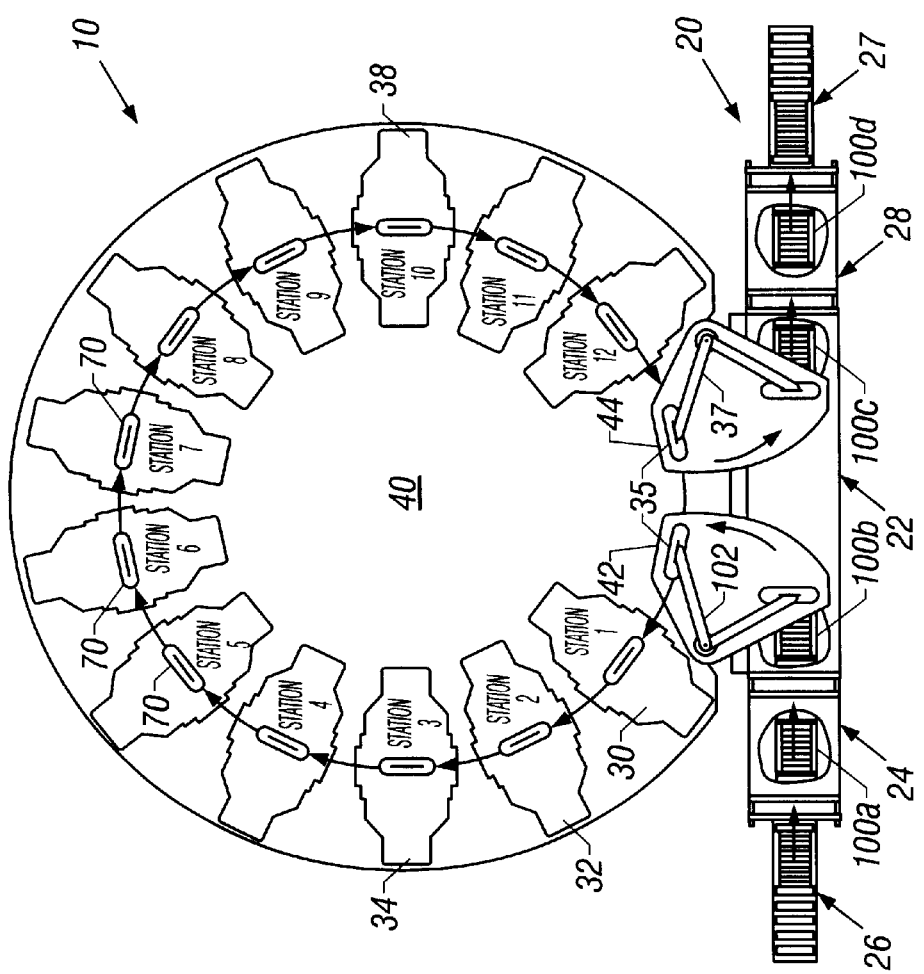
FIG. 2 illustrates the context of the invention within a processing system.

The context of the invention is illustrated in FIG. 2. As shown in FIG. 2, the system includes a processing unit 10 and a substrate handling system 20, together forming a system platform for accomplishing specific process steps in specialized modules or processing stations. The processing unit 10 includes a plurality of process stations 30, 32, 34, etc. mounted on a main vacuum chamber 40. Process stations 30, 32, 34, etc. in this example, are mounted in a circular arrangement with respect to a circular main vacuum chamber 40. Processing unit 10 further includes a loading station 42 for loading substrates/workpieces into the system for processing and an unloading station 44 for unloading processed workpieces from the system following processing. In a typical application, the workpieces are substrates for magnetic disks or optical disks. The substrate processing system may further include vacuum pumps, power supplies and a system controller (not shown).

The several process stations such as 30, 32, 34, 38, etc. may each include processing devices positioned in opposed facing relationship on opposite sides of a substrate processing location in order to process both surfaces. Within the prior art system of FIG. 2, processing devices may be sputter coating sources, heating devices, cooling devices, or any other processing device. The processing devices in the different process stations 30, 32, 34, etc. may be the same or different, depending on the requirements of the system. In the example of FIG. 2, the system has twelve process stations, loading station 42 and unloading station 44, which are symmetrically arranged.

Referring again to FIG. 2, the substrate handling system 20 includes a buffer vacuum chamber 22, a load lock 24, an entrance conveyor 26, an unload lock 28 and an exit conveyor 27. Cassettes 100a, 100b, 100c and 100d carrying substrates for processing enter buffer vacuum chamber 22 through load lock 24 and exit from buffer vacuum chamber 22 through unload lock 28. A load arm 102, in this configuration, transfers substrates from cassette 100b to disk gripper 35 in loading station 42. A carousel assembly within the main vacuum chamber 40 includes a plurality of substrate or disk grippers 70 in a circular arrangement. These carry the substrates of disks from station to station illustrated as Stations 1–12 in this Figure. An unload arm 37 transfers substrates from disk gripper 35 in unloading station 44 to cassette 100c. Substrate handling system 20 is described in detail in the aforementioned U.S. Pat. No. 5,215,420, which is hereby incorporated by reference.

According to a feature of the invention, one or more modules may be added to a substrate processing system, shown by way of example in FIG. 2 described above, to form an enhanced substrate processing system. In particular, the enhanced substrate processing system may include a primary processing assembly, such as the processing assembly shown in FIG. 2 and specialized processing modules, which may comprise one or more modules that are added to the primary processing assembly. Examples of suitable modules are shown schematically in above referenced U.S. Pat. No. 5,215,420. These modules are configured such that substrates are transferred in vacuum from the primary processing assembly to the various modules and back to the primary processing assembly. Furthermore, the primary processing assembly is isolated from a process module by one or more vacuum isolation chambers to minimize the movement of contaminants between assemblies. Modules can be added to the enhanced substrate processing system to increase the available number of process stations, to provide increased flexibility in processing, to isolate processes that generate contaminants from others that are sensitive to contaminants, or for any other reason. An individual module will ordinarily include a local module controller pertinent to the specific respective process steps carried out by that module/process station, whereas a system controller functions on a global level common to all modules. Thus, a "system platform controller" regulates and synchronizes workpiece transport, responds to error status reports originating in the substrate handling system or the several process modules, and may in the designer's choice be allocated functions related to matters pertaining to particular process modules, such as vacuum monitoring, process gas supply, workpiece biases, and the like.

Figure 1:
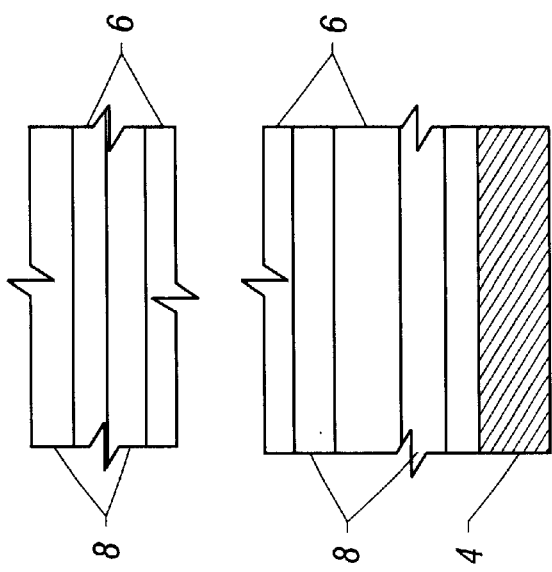
FIG. 1 shows a portion of a medium produced by the invention.
Figure 3A:
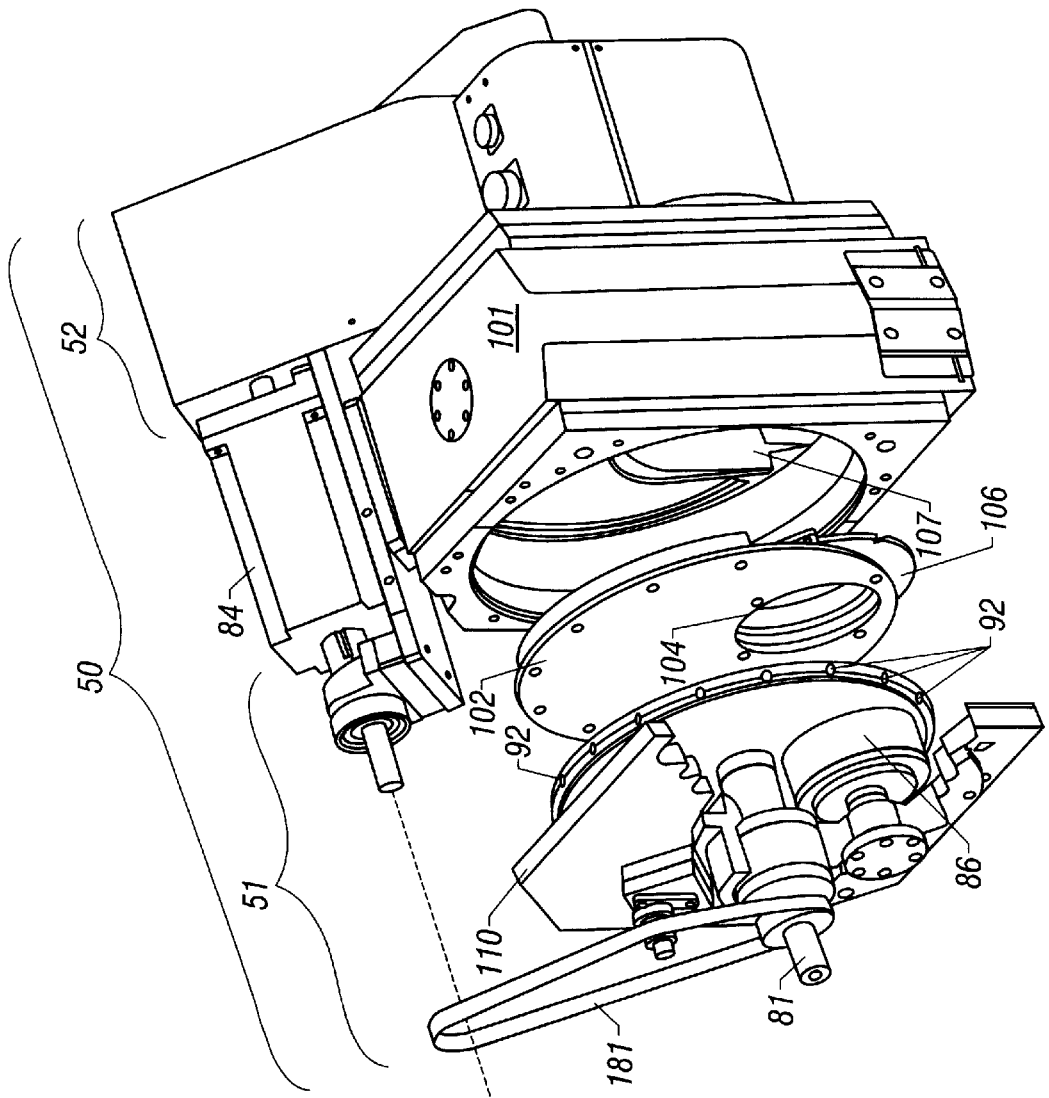
FIG. 3a shows a module of the present invention for incorporation within the system of FIG. 1.
Figure 3B:
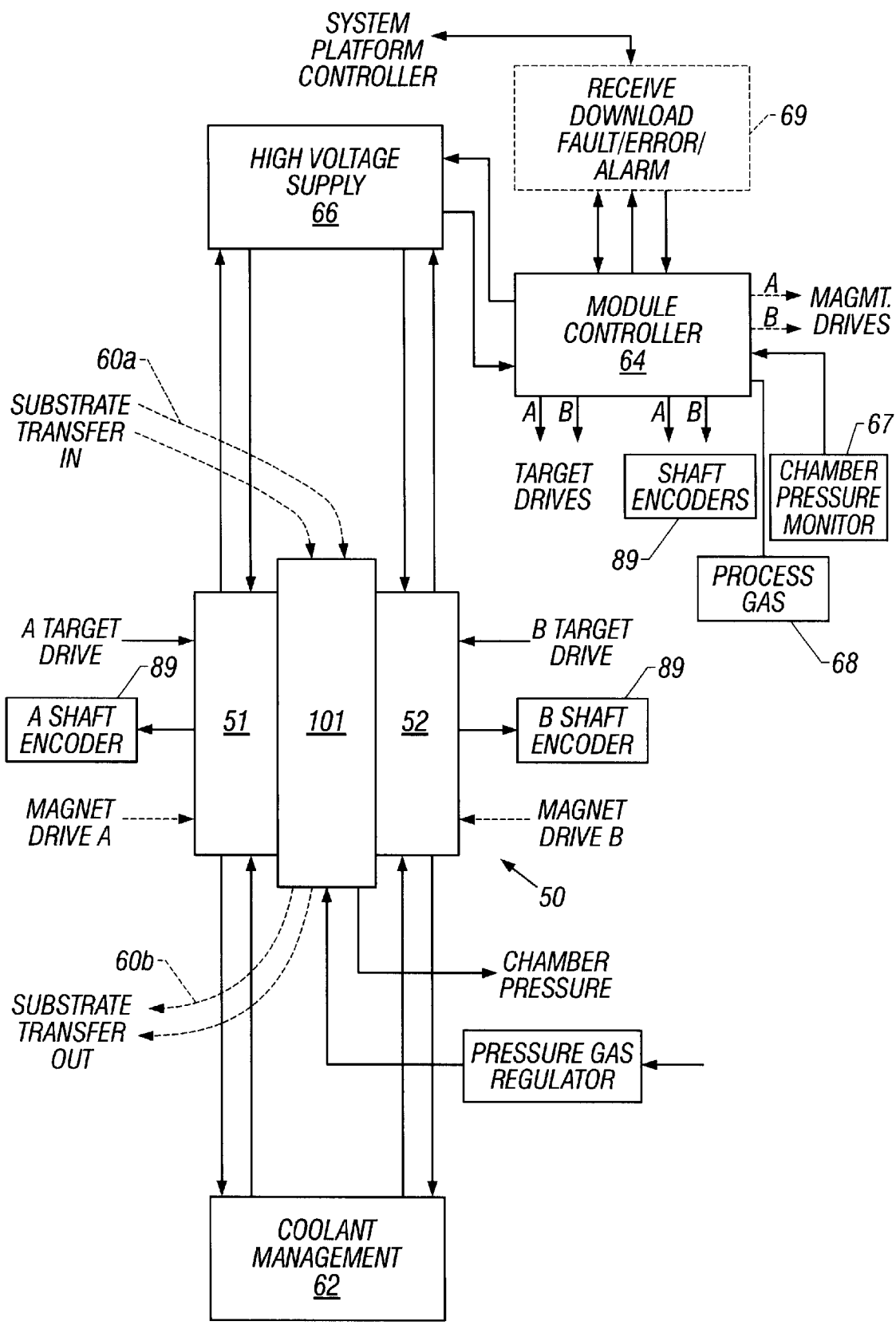

Turning now to FIGS. 3a, and 3b, there is shown a conceptual representation of a particular module of the present invention including sputtering assembly 50 (within the context of the representative system of FIG. 2) for multi-species sputtering to produce sequential film layered structures as suggested by FIG. 1. For purposes of specificity, apparatus for serializing two layer sequences will be presumed. As shown in FIG. 3b, the sputtering module 50, preferably encompasses a pair of sub-modules arranged in mirror symmetry about the plane of a planar workpiece to concurrently process opposite facing surfaces of the workpiece. The sputtering assembly 50 (see also FIG. 3A) includes vacuum housing 101 into which a substrate 48 is inserted into the interior space of the housing 101 by a known substrate transfer mechanism (not shown) operating through a transfer lock to avoid system contamination. These transfer mechanisms are well known and need not be discussed further. Modular sputtering assembly 50 comprises sputtering assemblies 51 and 52 for concurrent processing of opposite surfaces of substrate 48. Mounting plate 110 supports the various components of this system. These assemblies are preferably symmetric and identical in function and substantially identical in structure. Within sputtering assembly 50, substrate 48 is disposed opposite a target assembly, the latter comprising a rotating heat sink 80 in thermal communication with a surface on which are supported approximately 180° sectors 91a and 91b of cobalt and platinum respectively, immediately facing substrate/workpiece 48 Shaft 81 is driven by an appropriate motor 84 and belt 181 through known rotating vacuum seals whereby the motor 84 may be mounted outside the vacuum housing 101. A stepper motor (as hereinafter referenced) may serve this function, but a servo-motor may be employed with the requisite modification of mechanical and electrical design. On the opposite side of the rotating heat sink 80 and aligned with the substrate/workpiece 48, there is disposed magnetic pole assembly 86 that provides the requisite magnetic field for confining the sputter discharge. This pole assembly may be stationary, or may be independently rotated to achieve a still higher degree of uniformity in sputter coating where required. In FIG. 3B the letters A and B are used to illustrate like elements for each of the sputter assemblies 51 and 52. For example, Magnet Drive A indicates the magnetic drive used in assembly 51 and Magnet Drive B is used to indicate a like drive used in assembly 52. The driving force for these drives is shown as feeding out of Module controller 64 and into assemblies 51 and 52 in FIG. 3B. The same may be said for each of the Target Drives as well as the Shaft Encoders 89 (FIG. 3B). A shaft position encoder 89 provides a datum from which there is derived the azimuthal coordinate for the target shaft 81. Such encoders are well known and commercially available. Shaft angle resolution of 1 part in $10^3$/quadrant has been used for the present application. A suitable shaft position encoder for this purpose is commercially available from several sources, such as U.S. Digital, Vancouver, Wash.

The workpiece is introduced into housing 106 and supported therein by support arm or pedestal (not shown) representative of mechanisms well known in the art of workpiece handling. A baffle 107 delimits the space occupied by the fully positioned workpiece and pedestal from the remainder of the interior of chamber 101. Interposed between the workpiece and target wheel 91 is a first (plasma) limiting aperture 104 in mask 102. A second (sputter) limiting aperture in a second mask 106 is disposed between the workpiece and the plasma limiting aperture 104. The combination of these apertures protects the support arm 106 and the facing target wheel (not shown) of the symmetrical sub-module 52 In particular, it is important that both target sectors of the facing target wheel (of sub-module 52) and the (inactive) adjacent sector 91b (of sub-module 51) be protected from sputtering from target sector 91a in order to preserve the desired high degree of freedom from cross contamination. Further protection is afforded by the baffle 107 to the environment surrounding the workpiece. FIG. 3b shows the arrangement of the major component assemblies and functional elements of the sputtering module of the present invention for incorporation within a processing tool exemplified by apparatus such as shown in FIG. 2. This specific example contemplates two-layer sequences concurrently deposited on opposite sides of a workpiece or substrate. FIG. 3b shows the relationships of the component subassemblies of the module 50 and their relationships in a preferred embodiment. The module 50 includes a power supply 66 to excite sputtering target cathode(s), a pair of sputtering target sources 91a and 91b, controller 64, coolant management assembly 62 (including pumps, flow control and monitoring, heat transfer devices), and user interface 69. The module 50 is supported on a system platform, as previously discussed, which system platform controls the inflow 60a of workpieces/substrates into processing chamber 101 and the outflow 60b out from processing chamber 101. Chamber pressure is monitored (67) and a source 68 of process gas is admitted to the chamber, under control of the controller 64 or preferably as controlled by the system platform controller. The module 50 preferably operates in either of two modes. In a dynamic mode, each sputtering target 91a and 91b is enabled for deposition while in relative motion to the workpiece/substrate. Sputtering is enabled during the angular interval of rotation wherein the selected target sector entirely encompasses a projection of the workpiece/substrate on the target wheel. In an indexed, or static mode of operation, the target wheel is rotated to align the selected target sector to entirely encompass the projection of the workpiece thereon, and sputtering is enabled while the target and workpiece remain in static relationship.

Figure 4B:
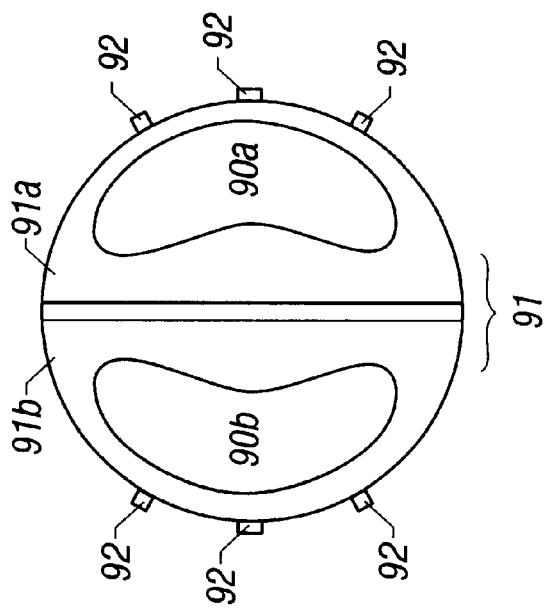
FIG. 4b is a two element sectored sputtering target.
Figure 4A:
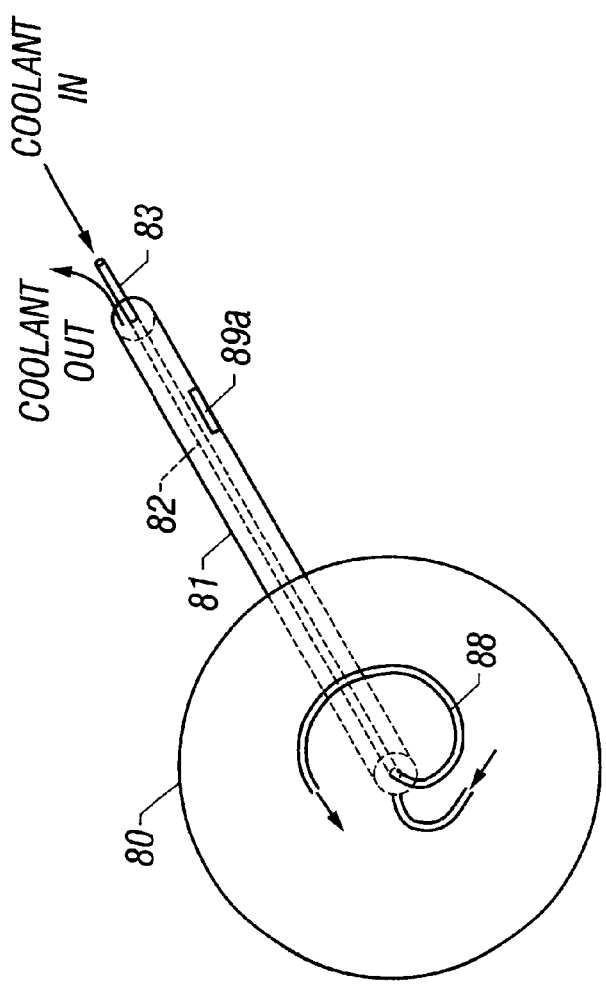
FIG. 4a shows a portion of a multi-element sputtering target.

Turning now to FIGS. 4a and 4b, there is shown a schematisized preferred embodiment of a (two) target assembly comprising a target heatsink 80 supported on a shaft 81 comprising coaxial passages 82 and 83. Cooling fluid flow is coupled to the rotating shaft 81 through rotatable hydraulic coupling of known construction (not shown). Such rotatable hydraulic couplings are commercially available, as for example, from Deublin Company, Waukegan, Ill. Serpentine passageway 88 is formed on heatsink 80 to provide a coolant duct between the coaxial spaces 82 and 83 for removal of heat from the heatsink 80 and the target facing, the latter formed from metallic sector plates 91a and 91b bonded to heatsink 80. A portion 89a of a shaft position encoder is conceptually shown. In the case of the two-sputterant example here shown, one sector 91a comprises cobalt and the other, 91b, comprises platinum for production of a series of Co—Pt bilayers of a storage medium. The heat sink provides a common electrical base for the sectored target. Note however, that in the alternative, the respective sector plates may be mutually electrically isolated. Regions 90a and 90b represent the respective erosion cavities resulting from sputtering. The method of forming the desired composite series of thin film bilayers from such a target is discussed below. Because of differences in mass and erosion rate, adjustable balance weights represented by balance weights 92 are provided to provide inertial balance to the rotating target. Apart from the significant difference in mass between different sputtering materials, such different sputterants erode at different rates, thus providing for a dynamically evolving imbalance in the target.

Moreover, the power dissipated in the plasma may be quite different for the respective targets, which may, in general, either reduce or enhance the difference in erosion rates for the target materials. It is desired to maintain any imbalance within limits to accommodate the specification of the servo motor and mechanical coupling provided for driving the target assembly. While various means may be employed to maintain acceptable balance, one simple arrangement provides for relatively adjusting peripheral balance weight sets 92 to overbalance the more rapidly eroding sector by an acceptable amount, and continuing operation until the imbalance of the rotating target assembly progressively reverses in favor of the opposite sector by a like increment in imbalance when sufficient relative erosion has occurred. Experience demonstrates that at such point, it is ordinarily required to replace the consumable sputterant(s). It is well known to log the consumption of a sputtering target and to indicate when end of target life is imminent. This function may be incorporated within the sputter module controller 64 if desired, as further described below.

During a sputtering deposition, a high voltage bias of the order 103 volts with respect to the workpiece and surrounding housing is applied to the target 91 to initiate the plasma discharge. A conventional slip ring arrangement provides for connection of the shaft 81 to a high voltage power supply as further described below.

Figure 4C:
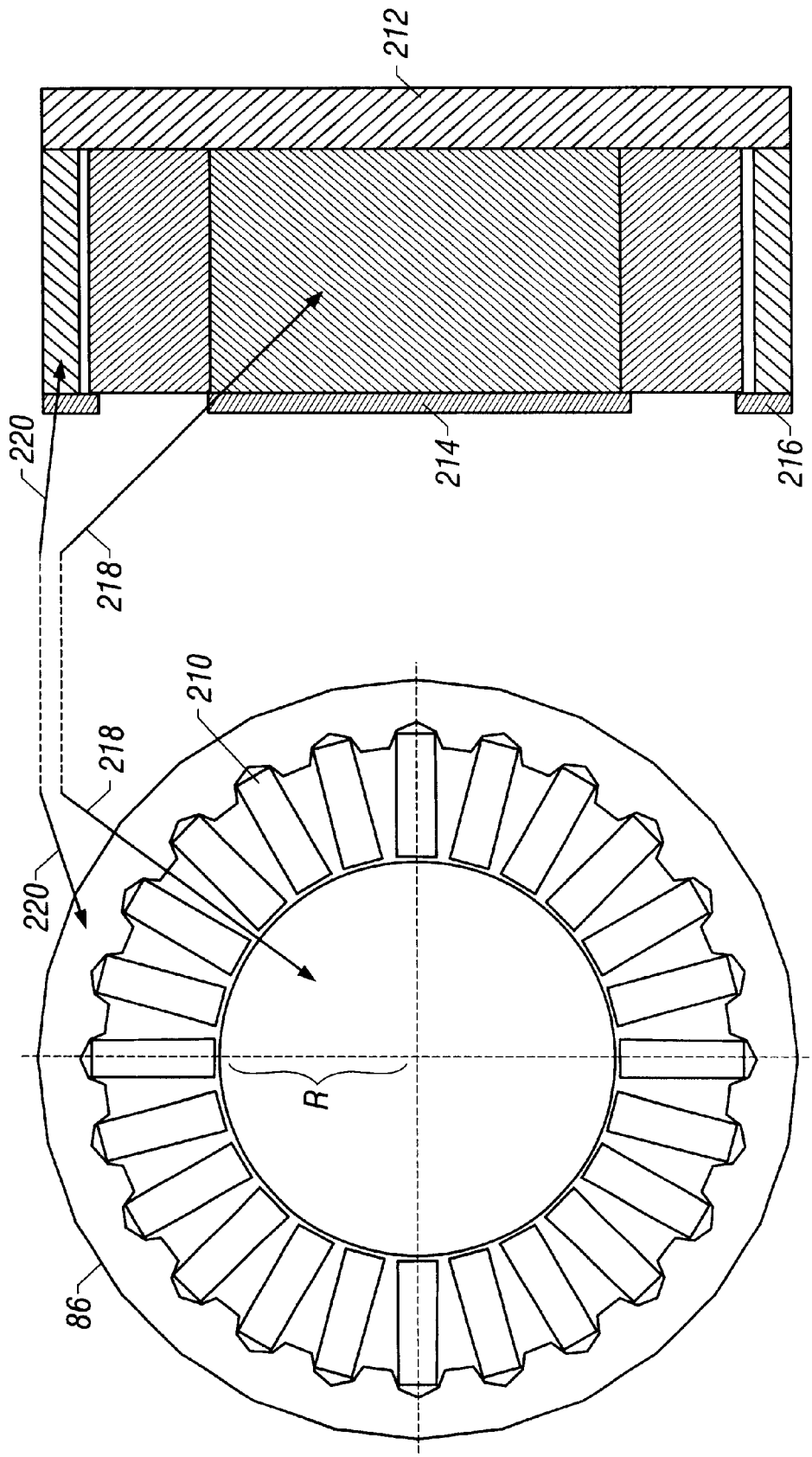
FIG. 4c is a stationary multi-pole magnet for plasma discharge confinement.

Turning now to FIG. 4c, the desired magnetic field distribution is obtained from a conventional many-poled radial design. Properties of the plasma distribution are determined by the magnetic field distribution. One exemplary form for a stationary magnet array 210 consists of 24 magnets arranged in radial symmetry on a non-magnetic base 212 and within magnetic inner and outer housings 218 and 220. The inner and outer housings provide flux return paths for the magnets 210. The dimensions of inner and outer field clamps 214 and 216 are adjusted to shape the magnetic field distribution $B(r, \phi, z)$ in the region facing the field clamps 214 and 216. In typical use, the magnet array 210 are each NdFeB prisms exhibiting field energy of approximately 35 to 45 MOersted-Gauss. The stationary arrangement of this pole assembly has been found acceptable for production of sputtered layers of satisfactory uniformity on workpieces of diameter in the range 65 to 95 mm—positioned at a distance of about R=50 mm from the surface of the cathode. In another embodiment the magnet pole assembly 86 is rotatable about an axis fixed with respect to the workpiece by a separate motor (not shown) to obtain an improved spatially averaged plasma confinement field. Many magnet pole configurations are known to serve the present purpose.

Local pressure conditions within the sputtering volume are an important specification for the sputtering process step. A local non-contaminating vacuum pump, not shown, operates to maintain a desired ambient pressure in combination with a controlled inflow of the plasma gas, typically argon, and a chamber pressure measurement device. Gas flow control is maintained at a selected rate with a commercially available mass flow controller.

The plasma density distribution is determined by magnetic confinement. The plasma density decreases sharply at the lateral edge of the distribution and the resulting geometrical definition is essential in the present apparatus to limit the projection on the target of the plasma distribution. Aperture 104, further limits the trajectories of sputtered flux in the reverse direction toward the workpiece. A workpiece limiting aperture 106 is aligned with the workpiece and limits the sputtered flux to the workpiece. These apertures and the workpiece are typically held at ground potential, but embodiments utilizing non-ground biases are deemed to be within the scope of the invention.

Design parameters for an exemplary module 50 were obtained from studies of the erosion pattern on a stationary target under typical operating conditions (argon gas at 40 mTorr, cathode potential at −200 to −600 volts). From these studies, one obtains the lateral extent of the distribution of charged particles incident on the target for a given magnet array 210. These erosion patterns indicate sputtering to be spatially confined to a region of 2.5 inches on the target surface. Accordingly, a 2.5 inch aperture 104 is aligned with the central axis of magnet array 210 and spaced (0.08 inch) from the target surface. Aperture 106, spaced 0.25 inch from the workpiece is sized to closely match the size of the workpiece. Although circular symmetry has been discussed, the invention is not limited to any particular geometry.

Sputtering is a well understood phenomena that has been in use for more than forty years for deposit of thin layers of selected materials. A sputtered film exhibits a thickness which is a function of the properties of the sputter target material, geometry (position of workpiece in respect to the sputtering target and the plasma discharge), character of the plasma (power dissipated in the discharge, character and pressure of the plasma gas), duration of sputtering exposure and electrical biases applied to the workpiece and/or elements of the sputtering apparatus.

Figure 5D:
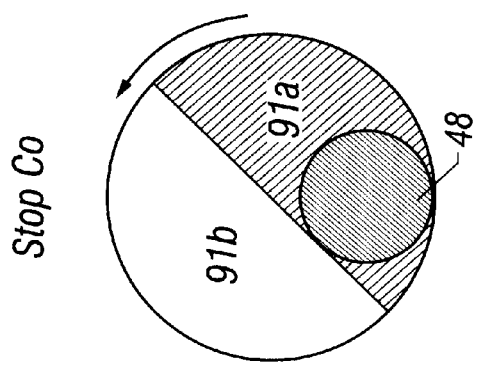
FIGS. 5a–d shows the rotational progression for a 2 element sputtering program.
Figure 5C:
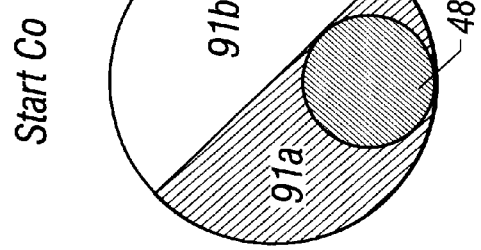
Figure 5B:
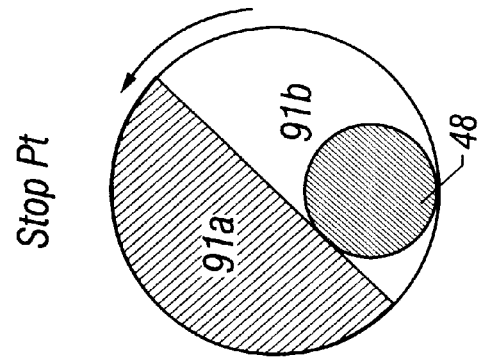
Figure 5A:
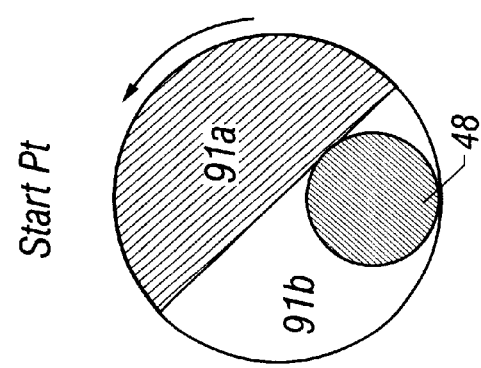

In dynamic mode operation, a sputtered film of thickness $T(P_w, p, \delta, V_s)$ is obtained during an angular interval $(d\phi/dt) \Delta t$ where $-\phi$ is the angular coordinate of the rotating target assembly and $\Delta t$ is a time increment, $P_w$ is the instantaneous power dissipated in the plasma, $-p$ is the pressure, $V_s$ is the workpiece bias and $-\delta$ is a measure of the relative separation of the workpiece and the target surface. For a given rotational rate, the thickness of a given layer is limited during any single exposure to a target sector. FIGS. 5a through 5d show relative orientations of the workpiece 48 and the two-sectored target 91, here cobalt and platinum for specificity. As the rotation of the target places the projection of the workpiece and projection of the plasma distribution on the target entirely within the Pt sector (FIG. 5e), a controller 64, responsive to the shaft position encoder 89 enables high voltage to the rotating sputtering target 91 through a conventional brush arrangement, thus initiating the deposition of a platinum layer on the workpiece. When the target 91 has rotated through an angular increment (here, 90°) sufficient for the workpiece projection and the plasma distribution projection to reach the Pt deposition limit (proximate the Co—Pt boundary, for example) the deposition terminates. The controller detects this proximity through the signals provided by the shaft position encoder 89 and interrupts the cathode high voltage supplied to the target (FIG. 5b). Further rotation of the target brings the projection of the workpiece and the plasma distribution projection entirely within the Co sector as indicated through the shaft position encoder signal, upon which the controller 64 again enables high voltage from power supply 66 to the target (FIG. 5c). Sputtering continues through rotation of the Co sector until the shaft position encoder signal indicates proximity to the preselected stop-sputtering position in proximity to the Pt—Co boundary. Because it is preferred for the projections of the workpiece and plasma distribution on the target to lie entirely within one target sector, there will be angular intervals during which there will be no sputtering. The resulting duty cycle depends upon the relative dimensions of the workpiece/plasma distribution and the target as a limit and upon the actually selected start and stop points, which may be displaced within the limiting angles. For the illustrated case shown in FIGS. 5a–d, one recognizes that the duty cycle for effective operation approaches 50% to assure that sputtering is not enabled during an angular interval when portions of both target sectors 91a and 91b are proximate the plasma distribution projection on the target 91.

For the deposition module based upon circular symmetry as shown herein, the relative dimensions of the workpiece and the target 91 are an important basis of the operating parameters of the system. Multiple discrete target arrays arranged in a rectilinear geometry are a variant of the above described processing module. Heat is removed from each of the sputtering targets of the respective sputtering devices 51 and 52 through the agency of a cooling subsystem 62, including cooling pumps, heat exchangers, water chiller, temperature and mass flow sensors and the like to support the requirement to remove about 1.5 kilowatts of thermal power from each sputtering device of the sputtering assembly 50 using a coolant flow (water, ambient inlet temperature) of 1 liter/second. Cooling management subsytem 62 is of conventional design and construction and need not be described in detail.

Sputter module controller 64 ("controller 64") drives the rotating target 91 incorporating sputtering targets 91a, 91b (and optionally, rotating plasma confining magnets), receives shaft angular position information from respective shaft position encoders supporting the rotating targets. From this shaft position encoder information, controller 64 enables outputs of the high voltage power supply 66 to sputtering targets of the respective sputtering assemblies 51 and 52 during pre-selected angular intervals of rotation of the corresponding multi-element target wheels. The controller also selects the power level for the corresponding target sector prior to gating power on.

Controller 64 also monitors a variety of local error conditions continually and returns an error status condition to the system platform controller. Controller 64 also initializes itself for practice of the prescribed recipe from information supplied through the user interface 69.

Figure 8:
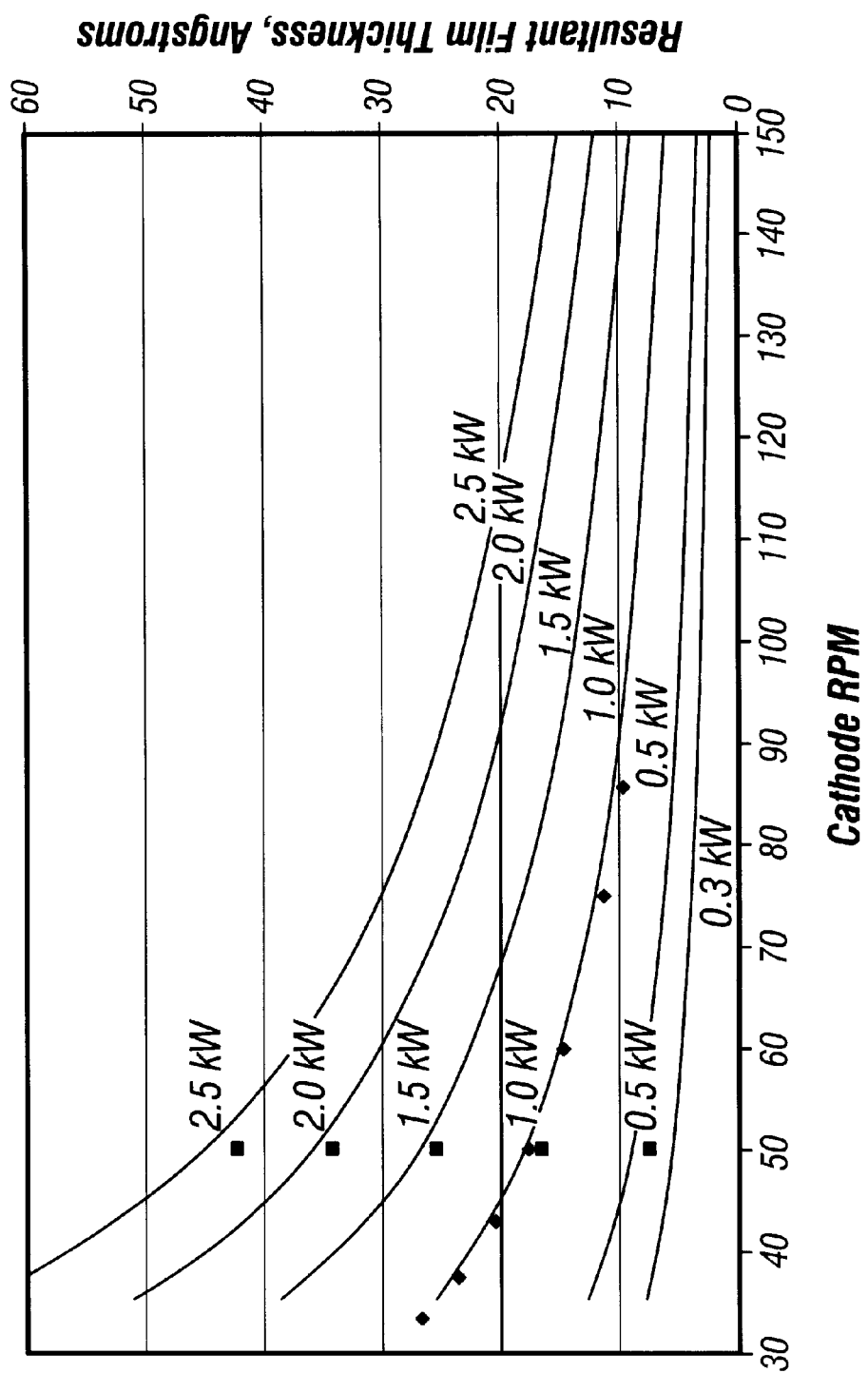
FIG. 8 shows single layer film thickness as a function of target rotation rate and plasma power.

The geometry and pressure are essentially unchanging during a production sequence, but the power, number of bi-layers and layer thicknesses are clearly selectable through operation of the controller 64. In particular, power is selectably controllable over a wide range and is established at selected discrete values corresponding to the target materials. FIG. 8 shows illustrative dependence of relative film thickness for a variety of values of power dissipation and target assembly revolution rate for a 15 bilayer Pt—Co sequence. The curves are computed for a variety of values of power dissipation at the target required to deposit at a sputtering rate of 60 Angstrom/kW-s. The diamond shaped points represent actual deposited film data obtained at a nominal power dissipation of 1 kW and measured by X-ray fluorescence. A variety of film thicknesses as a function of actual power dissipation at constant cathode rotation rate are shown by the square data points. The thickness is clearly limited by the time interval during which the discharge is enabled. This interval may be further limited by pulsed operation, or, the interval may be expanded by sputter depositing only one selected material during successive revolutions of the multiple target assembly.

For fabrication of media for information storage, it is usual practice to produce storage capability on opposite plane surfaces of the medium. The module here described is easily symmetrized for this purpose, as discussed above, by disposition of a second target assembly, e.g., 52, proximate the second side of the workpiece. Several components of the module may be shared between the separate planar depositions. For example the same motor 84 may provide torque to the shafts of both target assemblies. The controller 64 typically operates both target assembles. A 5 Kw high voltage power supply operable in the range 0.2 to 1.0 kV has been found to suffice to excite and maintain the discharge for sputtering in accord with the invention.

The controller for the module of the present invention operates in cooperation with the introduction into the module and seating therein of the substrate for coating. FIGS. 7a–f shows a representative flow chart (in conventional flow chart notation) for dynamic execution of a sequence of bilayers sputtered from two targets, respectively TG1 and TG2 disposed on a common cathode/heatsink rotating with respect to a stationary workpiece. At 400, the general user interface supplies the operational recipe for the sequence. Initialization of the module 50 occurs at blocks 402 and the control program logic variables are similarly initialized at 406, 408, and 409 to reflect the recipe data derived from the user interface 400. The servo motor 84 is brought up to the prescribed rotational speed and a sequence is available for selecting one of two power levels to select the magnitude of power dissipation in the plasma corresponding to the respective targets when the plasma power is, in fact gated on after detecting the limiting angular position for the corresponding target (at 502, 602, 702, 802) and gated off after detecting the end of the sputtering sector (at 504, 604, 704, 804) for that target. The number of layers sputtered (or alternatively, yet to be sputtered) is incremented (decremented) to be treated as a loop index for further layer deposition. In a simple bilayer sequence the sputtered layer for corresponding targets is accomplished at respective magnitudes for power dissipation in the plasma and a power level may be immediately reset in anticipation of the next target sector.

Figure 6A:
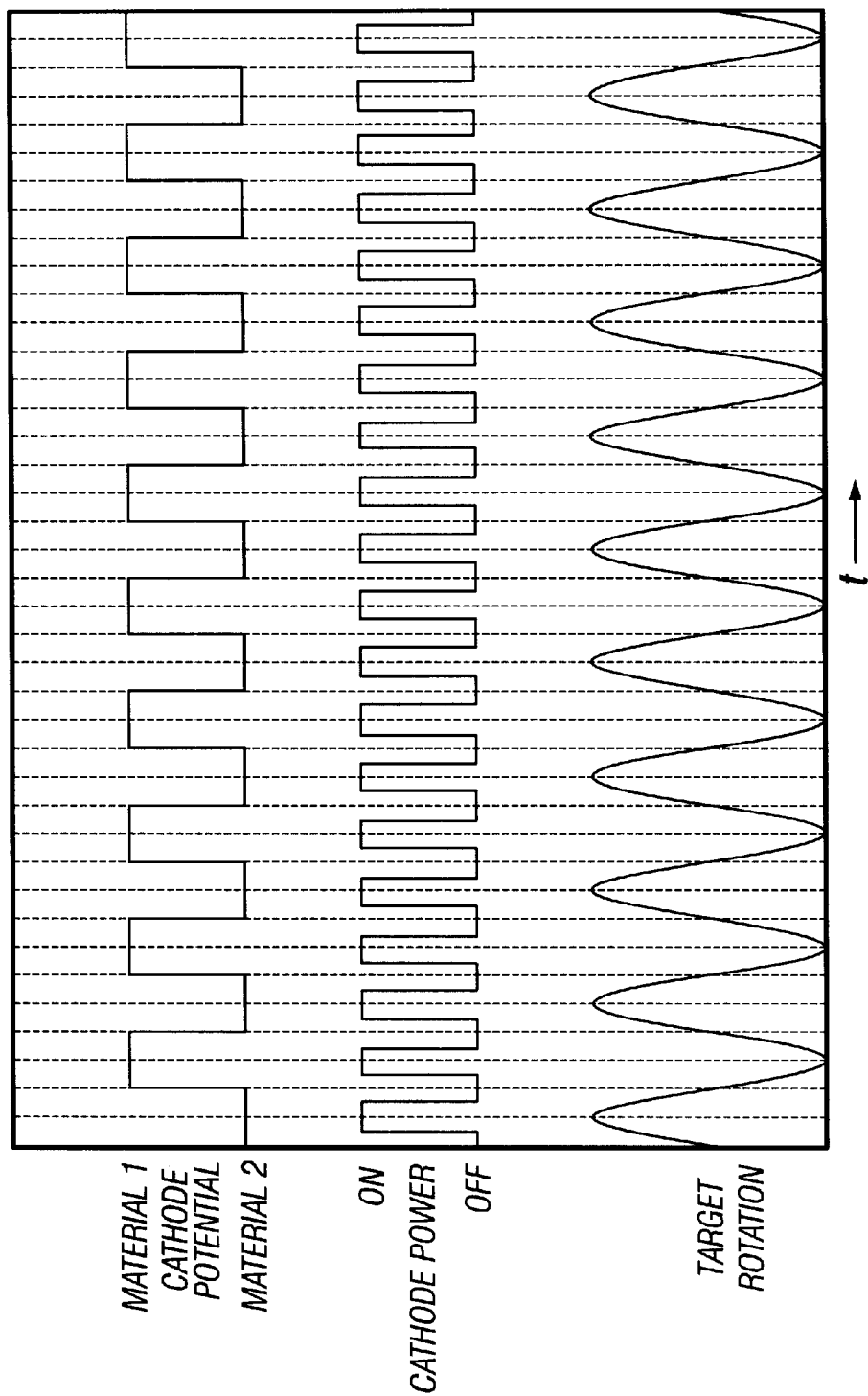
FIG. 6a shows a timing diagram for enabling a sequence of equal thickness layers of two materials.
Figure 7A:
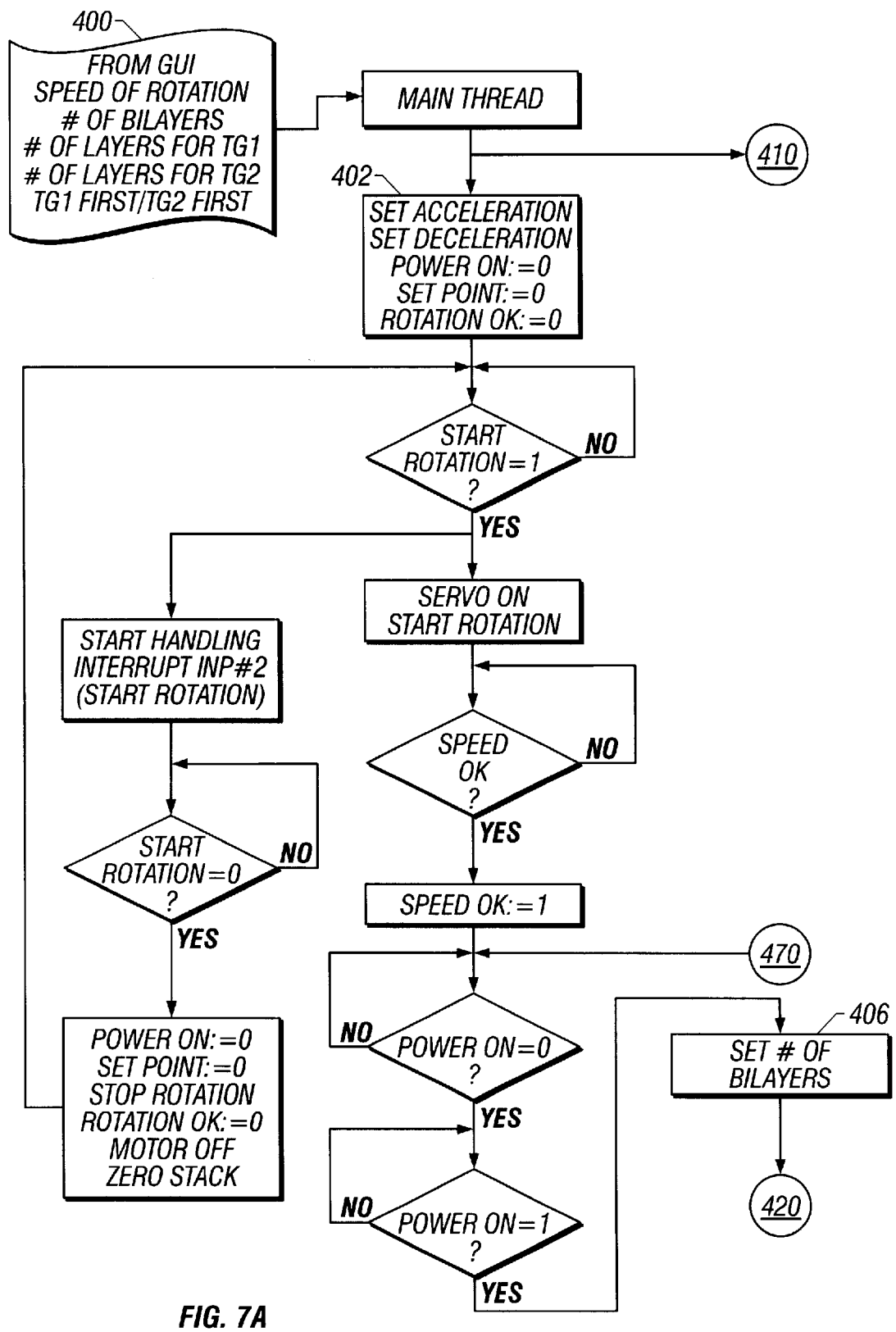
FIGS. 7a–f is a representative flow chart for a controller operating the module of FIG. 3.
Figure 7B:
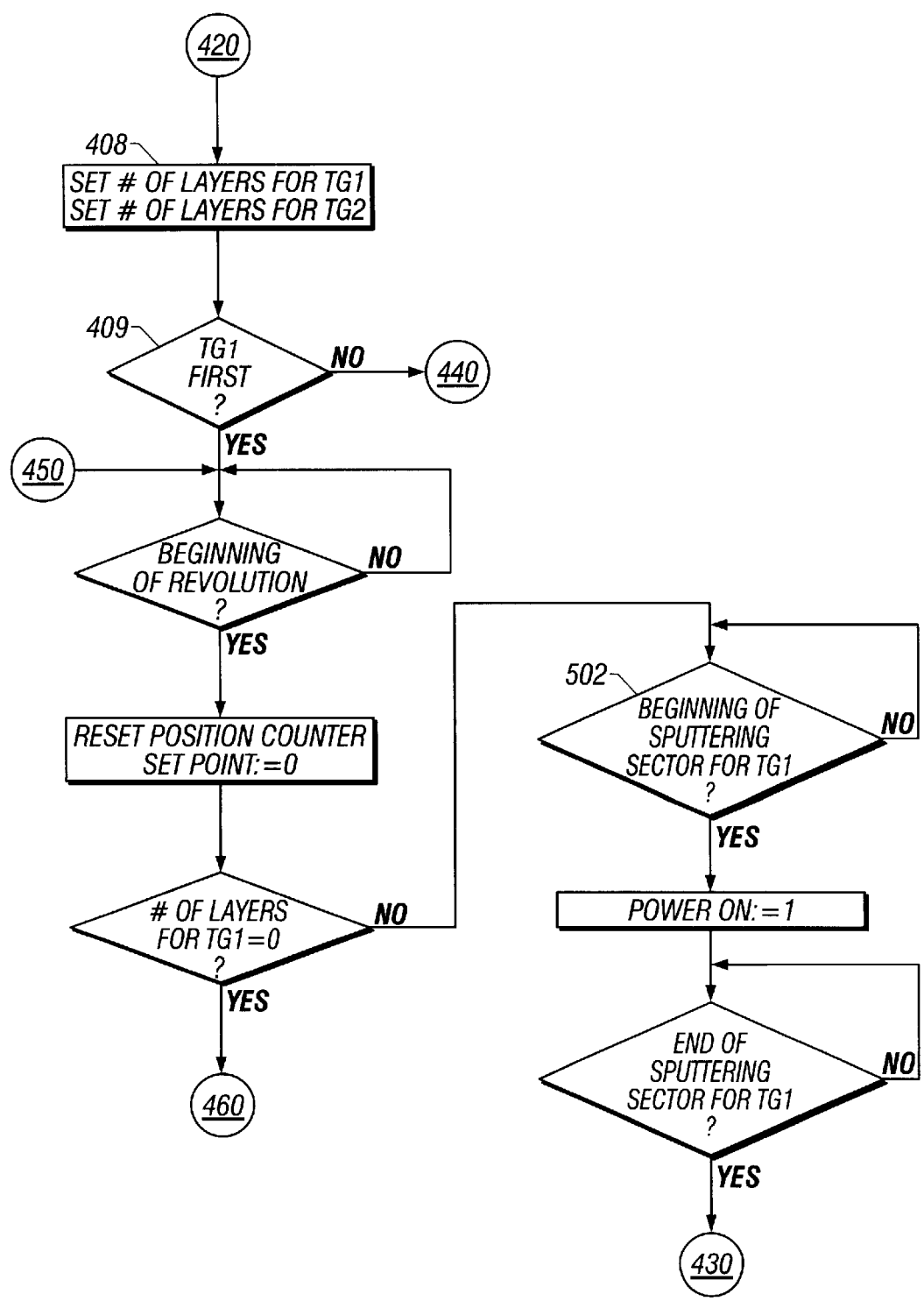
Figure 7C:
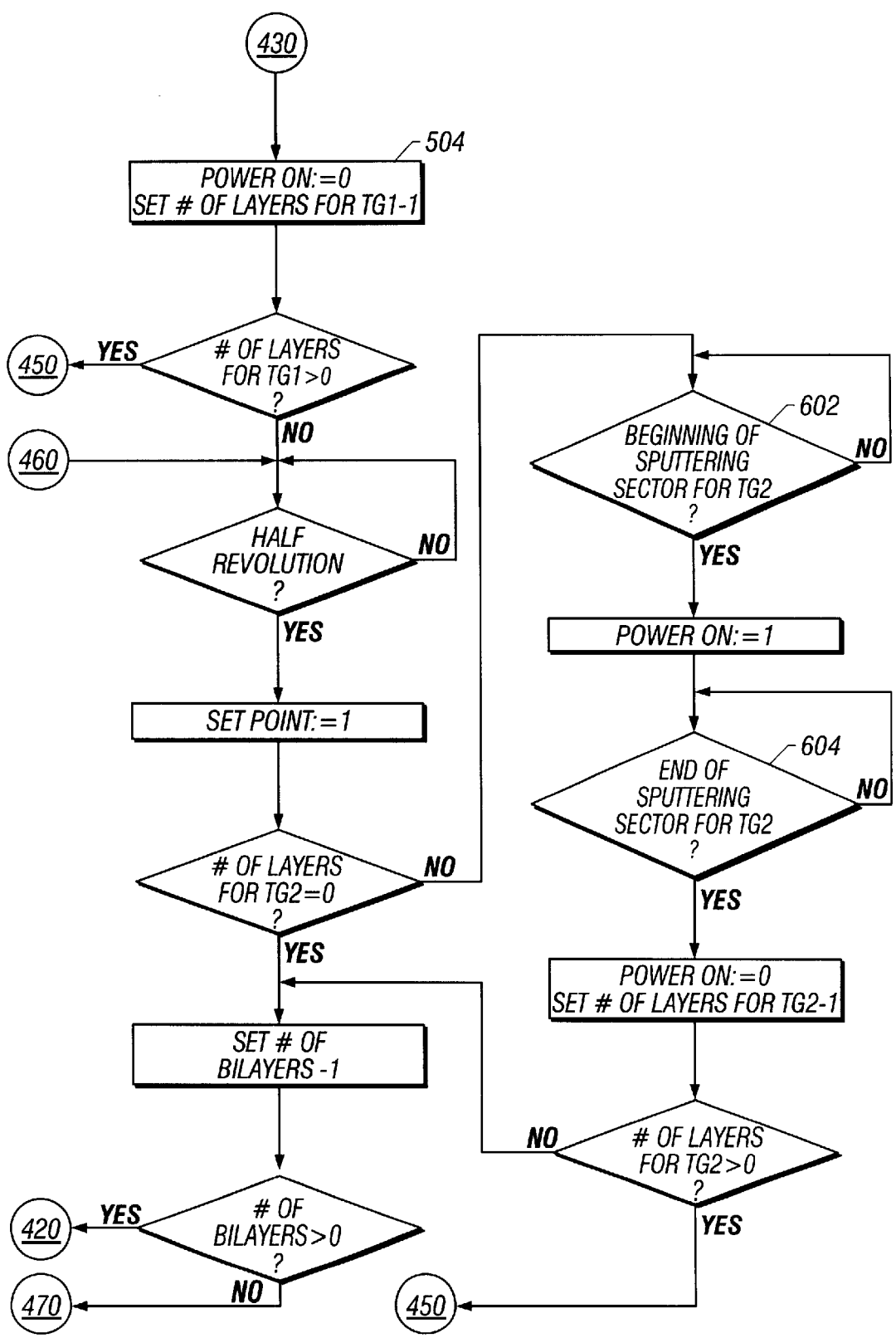
Figure 7D:
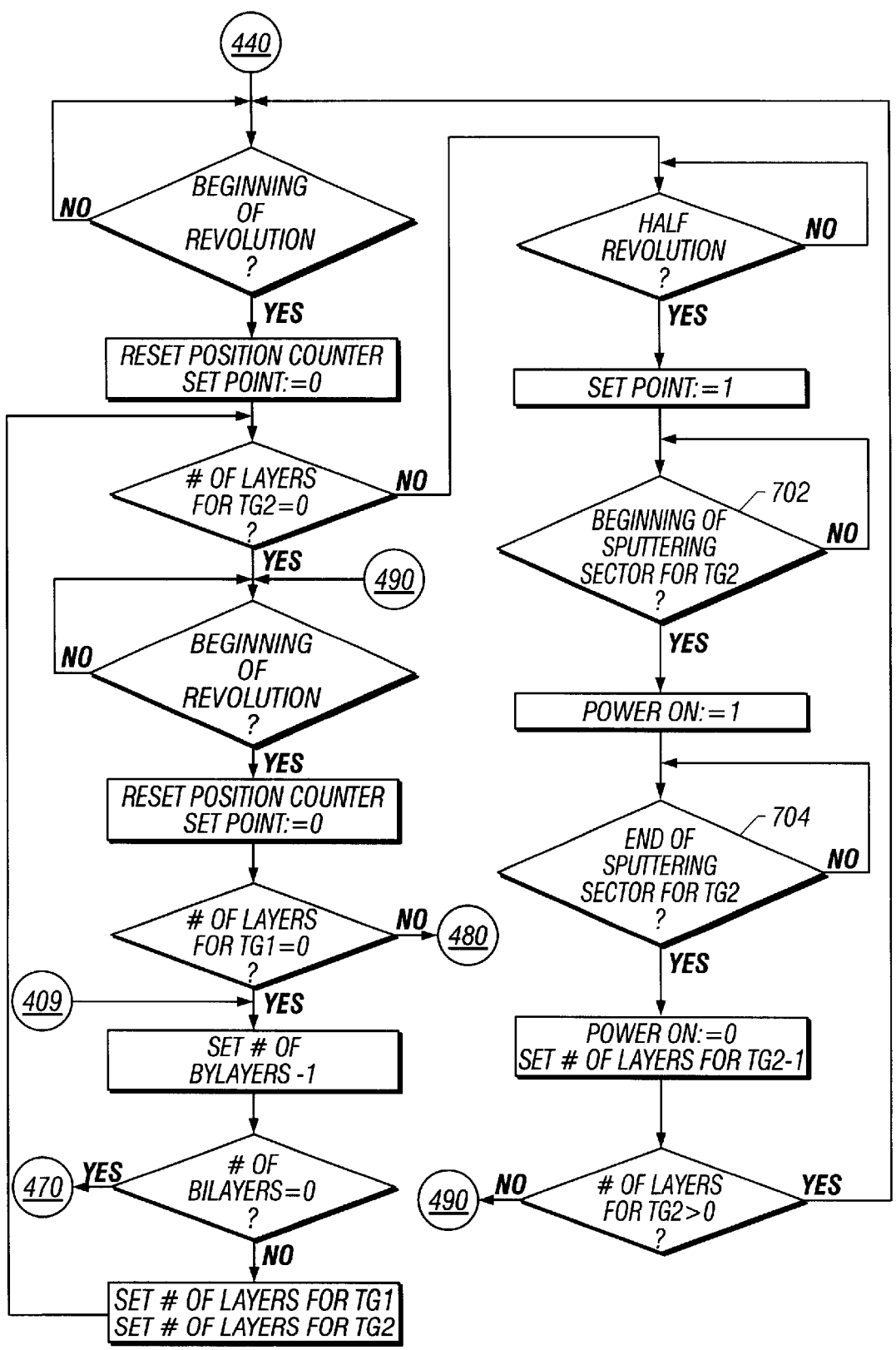
Figure 7E:
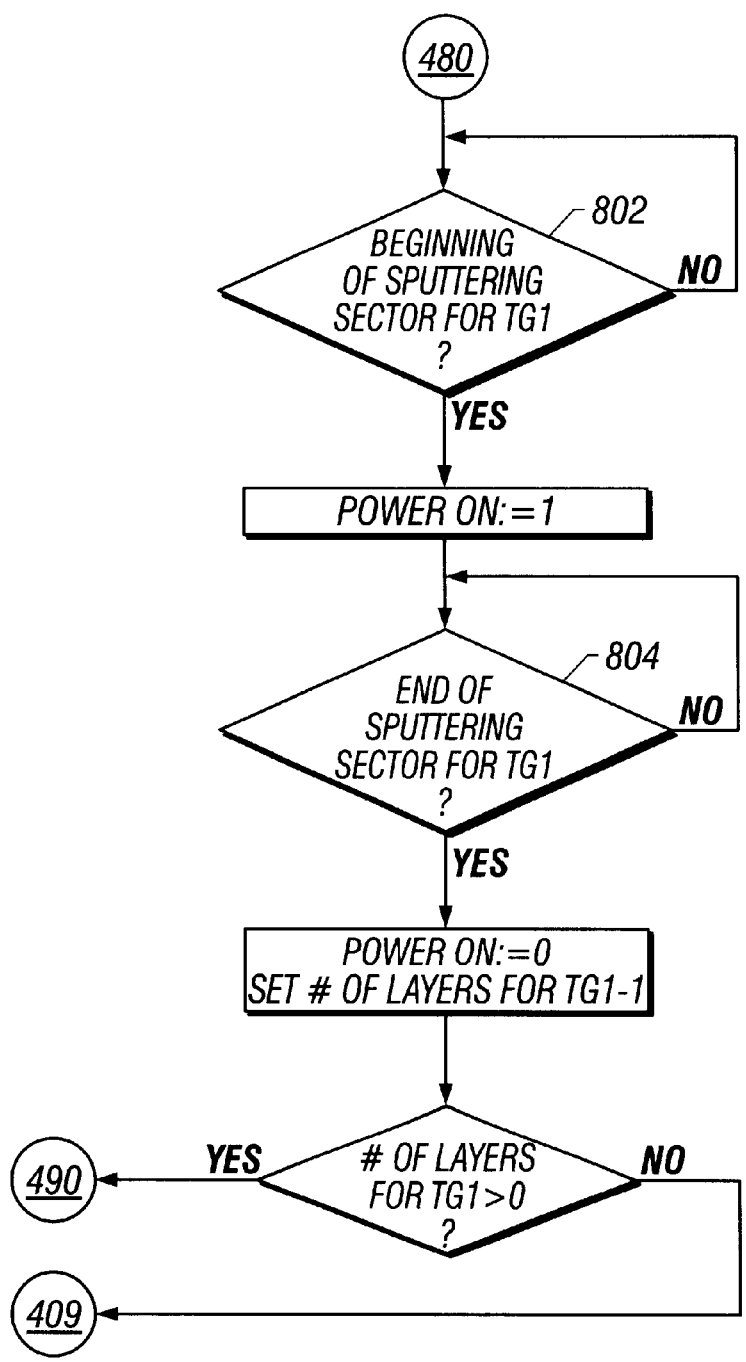
Figure 7F:
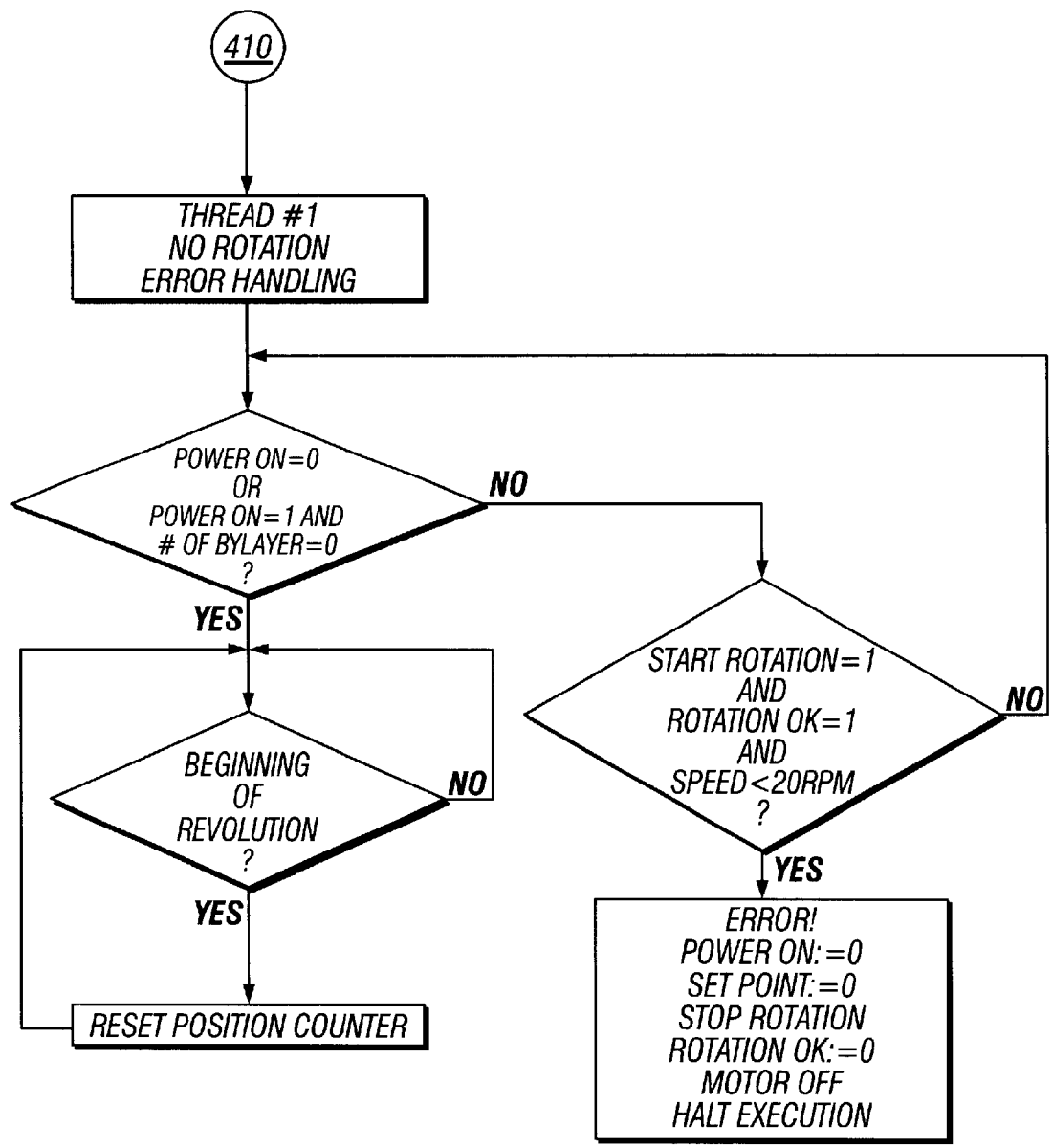

Apart from the main thread of process execution of FIGS. 7a–g, a status thread (FIG. 7f monitors a variety of conditions and furnishes the status of module 50 to the system platform controller. One readily appreciates that, for example, an error condition within module 50 requiring halted execution within module 50, affects prior process stations and the operation of substrate transport system 20. A more complex recipe, as exemplified in FIG. 6b calls for a similarly, albeit correspondingly more complex controller sequence. A static process execution is prescribed in a somewhat more simple set of instructions because the target wheel is directly positioned in the desired angular position.

FIGS. 7a–f concerns the management of a particular sequence of multiple depositions occurring in a specific sputter module 50. In order to illustrate this flow diagram, it was found necessary to spread the diagram across a number of figures and pages. For this reason indexing numbers are used to show where to continue on different pages. For example 410 appears on both of FIG. 7a and FIG. 7f and is intended to show the flow from 7a to 7f. 470 is shown indexed on FIGS. 7a, 7c and 7d. Other various indexing numbers such as 420 (7A to 7B to 70), 440 (output 7b, input 7d), 450 (7b to 7c) 460 (7b to 7c), 430 (7b to 7c), 490 (7d, 2 occurrences and 7e), 480 (7d and 7e), and 409 (out of 7d and in on 7e) serve a similar purpose of linking segments of this flow chart. Note that all of the numbers used for identification are shown encircled. In general, a substrate will have undergone processing in one or more prior substations, perhaps to produce a base layer(s). Subsequent process station(s) are available to deposit one or more distinct functional or surface protective layer as may be required by the ultimate device.

Many conditions, other than shown in the representative flow chart of FIGS. 7a–f, may be monitored or adjusted. For example, rotation of a rotatable magnet pole assembly 86, chamber pressure, status information originating in the system platform controller are typical of further parameters which may be treated in the controller 64. The erosion of each target portion may be separately logged and the status of the target (e.g., imminent end-of-life, useful target life remaining) determined and displayed or treated together with other module status information.

A timing diagram for application of a sequence of N equal bilayers of two materials is given in FIG. 6a. The rotation of the disk is indicated for graphical convenience in the sinusoidal curve at the bottom of the Figure. High voltage to the target is enabled in accord with the Cathode Power signal. For this example, the two materials each occupy approximately 180° of the target and in accord with maintaining exclusive sputtering from the respective materials (FIGS. 5a–d) Cathode Power On condition occupies 90° of target rotation centered within the respective Material Setpoint logic derived from the rotational encoder. The Material Setpoint Logic comprehends the operation of associating a particular value for the plasma power with the next material to be sputtered. FIG. 6b is an example of a generalization to the case where two materials are sputtered in successive layers in a 3:1, 2:2, 3:2 layer thickness ratios. For this sequence, during a $5\pi$ rotational interval, a first material M1 was sputtered 3 times (Cathode Power enabled 3 times), the second material (M2) was sputtered once during the next $\pi$ angular interval, M1 then sputtered once during the next $3\pi$ interval and M2 likewise sputtered once during the following $3\pi$ interval. During the next $5\pi$ of rotation, M1 is again sputtered 3 times during the appropriate $\pi/2$ windows followed by a $3\pi$ rotational interval during which M2 sputtering is enabled.

For a (typical) disk-shaped workpiece, the duty cycle per revolution for a rotating multi-target sputtering apparatus as described depends upon the relative angular sizes of the target sectors and the angular size subtended by the projection on the target of the plasma distribution. All other aspects of the process being equal, there is a geometric basis for the duty cycle for the dynamic mode of processing. Although the size of the workpiece is constrained by the invention, it is not the size of the workpiece that is the primary determinant of a duty cycle as that term is commonly understood. The requirement for non-cross contamination between adjacent layers of a sequence is stringent and is satisfied by the constraint that sputtering cannot commence unless the projection of the plasma distribution on the target sector lay entirely within that sector. (In the typical application, the projection of the workpiece on the target is aligned with, and no larger than the plasma distribution projection on the target as limited by appropriate apertures. It follows that, in relative rotation, sputtering is not enabled until the trailing edge of the plasma projection on the target has crossed a first sector boundary, and sputtering must be disabled as the leading edge of that projection approaches the remaining boundary of that sector. Thus, the angular size of the sector must be greater than the angular size subtended by the plasma distribution from the center of target rotation. In the simplest case, as exemplified herein, there are two target sectors of equal angular size. The maximum angular size of the plasma distribution is $\pi/2$ and the duty cycle per revolution for each sputter-deposited film approaches 50%.

A commercially important genre of product of the invention is the media for rotating mass memory. Although it is a design choice to accommodate a range of substrate dimension, as a practical matter, such disk memory media is dimensionally fixed by industry standards. For a relatively large value of the target wheel radius, the sputtering target sectors become proportionally more expensive, and the rotational moment of inertia increases roughly as the square of the target radius. Consequently the motor for driving the target wheel must be specified accordingly. For the embodiment described above, a prototype has been constructed using a target wheel diameter of 12.5 inches for producing a series of Co—Pt layers on both sides of a substrate of up to 95 mm diameter from a 2 sector target, each sector subtending substantially $\pi$.

A duty cycle for dynamic operation implies a non-operative interval. For the arrangement described above, the duty cycle is a consequence of the geometry. In a slight variation of operation, the duty cycle may be dynamically increased by accelerating the motor 84 within the non-sputtering region of rotation and decelerating back to the prior state of motion as the target sector boundary is approached. It is a preference, but not a requirement, that dynamic mode deposition occur at a constant rate of relative motion.

The circular geometry example discussed above has a further degree of freedom in the choice of size for target area portions. While equal 180° sectors has been discussed and shown, the choice of sector size is dependent upon process and workpiece-size. The smallest size sector must be at least as large as the workpiece to accommodate the static mode of processing, and for cross-contaminant free dynamic mode processing the angular size of the plasma track on the target must be less than the angular size of the target sector, in accord with the requirement that sputtering is only enabled while the plasma projection on the target is wholly within the boundaries of a given sector.

Combination of the two processing modes represents yet another embodiment illustrative of the flexibility of the invention. For example, consider a $\pi/2$ sized target sector "A" and a $3\pi/2$ sized target sector "B". In this example, a $\pi/2$ sized workpiece may receive static sputtering from target sector A and dynamic sputtering from target sector B.

Although this invention has been described with reference to particular embodiments and examples, other modifications and variations will occur to those skilled in the art in view of the above teachings. The relative size of target sectors and workpiece may be other than as described, except as expressly limited. The number of target sectors is a matter of process choice. It should be understood that, within the scope of the appended claims, this invention may be practiced otherwise than as specifically described.

What is claimed is:

1. A method of sputter depositing a sequence of homogenous layers on a workpiece in which adjacent said layers comprise diverse species, said method carried out within a housing, comprising the steps of
   (a) preparing a first sputterable species on a first portion of a target substrate and preparing a second sputterable species on a second portion of said target substrate,
   (b) disposing said workpiece in substantial proximity to one selected said portion of said target substrate,
   (c) introducing an inert gas into said housing and establishing an electrical plasma discharge within said housing to provide a source of ions for sputtering from said target,
   (d) imposing a magnetic field to confine said plasma discharge, applying a bias potential to said target portion and interposing an aperture to limit ions from said plasma incident on said target to said selected portion of said target and sputter depositing on said workpiece said species of said one selected portion, (e) disposing said workpiece in substantial proximity to another selected said portion of said target substrate and (f) causing continuous rotation of said target substrate during sputtering as to sequence a first sputterable species and then a second sputterable specie adjacent to said workpiece.

2. The method of claim 1 further comprising sputter depositing on said workpiece another said species from said another selected portion.

3. The method of claim 1 wherein said steps of disposing comprises orienting a surface of said workpiece substantially conformal, facing and spaced from said target substrate.

4. The method of claim 3 wherein said step of sputter depositing further comprises limiting sputter deposition to said surface spaced from said target substrate.

5. A method of applying successive coatings upon a workpiece by sputtering from a succession of sputtering target portions of a common target substrate, comprising (a) causing a state of continuous relative motion between said workpiece and said common target during sputtering operations, (b) sensing a first pre-selected relative disposition of one said target portion in relation to said workpiece and initiating a sputter deposit from said target portion, (c) terminating sputter deposit from said target portion while continuing continuous relative motion between said workpiece and said common target, (d) repeating steps (b) and (c) in respect to another target portion of another material.

6. The method of claim 5 wherein said steps of initiating and terminating occur during said state of relative motion.

7. The method of claim 5 comprising ceasing said relative motion after said step of sensing.

8. The method of claim 6 wherein said step of terminating further comprises accelerating said target until proximity to the relative disposition of another target portion is sensed, and then decelerating said target to return to said state of relative motion.

9. A target assembly for sputter deposition of a plurality of sputterable materials, comprising (a) a heat sink comprising a network of ducts therein and having an inlet and an outlet for circulation of a coolant fluid, (b) a plurality of discrete sputterable target portions disposed in thermal communication with said heat sink, each said portion containing one selected sputterable material (c) a shaft supporting said heat sink for rotational motion, said shaft comprising a coaxial tubular structure defining two spaces for passage of said cooling fluid in respective directions toward, and away from said heat sink, said cooling fluid in thermal communication with said heat sink, and (d) said shaft further including a shaft encoder for establishing the azimuthal position of said shaft.

10. The target assembly of claim 9 further comprising electrical isolation between said plurality of discrete sputterable target portions.

11. A sputter deposition module for depositing a sequence of disparate sputtered films on a workpiece surface, comprising (a) a vacuum tight enclosure adapted for insertion and removal of said workpiece, (b) a target assembly forming a portion of said enclosure said target assembly for non-concurrent sputter deposition of each of a plurality of sputterable materials on said workpiece, comprising a heat sink comprising a network of ducts therein and having an inlet and an outlet for circulation of a coolant fluid through said heat sink, a plurality of sputterable target portions disposed in thermal communication with said heat sink, each said portion containing one selected sputterable material, (c) a motor adapted to produce continuous relative motion between said target assembly and said workpiece during sputtering operations, (d) an electrical power source for initiating a plasma discharge, and (e) a shaft position encoder for sensing the relative position of said target assembly and said workpiece.

12. The sputter deposition module of claim 11 further comprising a magnetic pole assembly for confining said plasma discharge to a selected region.

13. The sputter deposition module of claim 12 wherein said selected region comprises an area greater than said workpiece surface on which sputter deposition takes place.

14. A method of applying successive coatings upon a workpiece by sputtering from a plurality of sputtering target portions disposed upon a common target substrate, comprising a) causing a state of continuous relative motion between said workpiece and said common target during sputtering operations, b) sensing a first pre-selected relative disposition of a first said target portion in relation to said workpiece and initiating sputter deposition from said target portion, c) sensing a second pre-selected relative disposition of said first said target portion to said workpiece and terminating sputter deposition from said target portion, and d) sensing a first pre-selected relative disposition of a second said target portion in relation to said workpiece and initiating sputter deposition from said target portion.

* * * * *